United States Patent
Chen et al.

(10) Patent No.: US 10,917,723 B2
(45) Date of Patent: Feb. 9, 2021

(54) AUDIO SIGNAL PROCESSING DEVICE AND AUDIO SIGNAL ADJUSTING METHOD

(71) Applicant: ALi (China) Corporation, Shenzhen (CN)

(72) Inventors: Yue-Yong Chen, Guangdong (CN); Ben-Xiang Qu, Guangdong (CN)

(73) Assignee: ALi (China) Corporation, Shenzhen (CN)

( * ) Notice: Subject to any disclaimer, the term of this patent is extended or adjusted under 35 U.S.C. 154(b) by 0 days.

(21) Appl. No.: 16/702,336

(22) Filed: Dec. 3, 2019

(65) Prior Publication Data
US 2020/0296511 A1    Sep. 17, 2020

(30) Foreign Application Priority Data
Mar. 14, 2019   (CN) .......................... 2019 1 0192732

(51) Int. Cl.
*H03G 5/00*    (2006.01)
*H04R 3/04*    (2006.01)
*G10L 25/51*   (2013.01)
*G10L 21/034*  (2013.01)

(52) U.S. Cl.
CPC .............. *H04R 3/04* (2013.01); *G10L 21/034* (2013.01); *G10L 25/51* (2013.01)

(58) Field of Classification Search
CPC ........................................................ H03G 5/00
See application file for complete search history.

(56) References Cited

U.S. PATENT DOCUMENTS

| 8,717,211  | B2 | 5/2014  | Miao et al. |
| 9,197,181  | B2 | 11/2015 | Thyssen et al. |
| 10,165,361 | B2 * | 12/2018 | Thyssen ................... H04R 3/04 |
| 2011/0228945 | A1 * | 9/2011 | Mihelich ................ H04R 3/002 |
| | | | 381/59 |

\* cited by examiner

*Primary Examiner* — Olisa Anwah
(74) *Attorney, Agent, or Firm* — JCIPRNET

(57) ABSTRACT

An audio signal processing device and an audio signal adjusting method thereof. The audio signal processing device includes a gain determining circuit and an audio signal processing circuit. The gain determining circuit receives an analog audio signal. The gain determining circuit determines a gain based on a difference between a predefined threshold and an amplitude of the analog audio signal in response to detecting that a current sampling amplitude of the analog audio signal is greater than the predefined threshold. The audio signal processing circuit is coupled to the gain determining circuit and receives the analog audio signal and the gain. The audio signal processing circuit attenuates the analog audio signal according to the gain to generate an output audio signal.

16 Claims, 8 Drawing Sheets

AUDIO SIGNAL PROCESSING DEVICE AND AUDIO SIGNAL ADJUSTING METHOD

CROSS-REFERENCE TO RELATED APPLICATION

This application claims the priority benefit of China application serial no. 201910192732.8, filed on Mar. 14, 2019. The entirety of the above-mentioned patent application is hereby incorporated by reference herein and made a part of this specification.

BACKGROUND

1. Technique Field

The technique field relates to an audio signal processing technique, and more particularly, to an audio signal processing device capable of adjusting a gain and an audio signal adjusting method thereof.

2. Description of Related Art

With the advancement of technology, consumers are now paying more attention to an audio signal output quality of a multimedia playback device. However, when a speaker of the multimedia playback device is playing sound, the audio signal output quality may be limited by the capabilities of the speaker itself. For instance, based on a hardware structural design of the speaker, a maximum movable offset of a diaphragm of the speaker is quite limited. Therefore, the diaphragm of the speaker may not be able to produce a corresponding ideal offset in respond to an excessively loud audio signal, that result in a broken sound due to a clipping distortion and damage to the speaker. In other words, when the volume is too loud, not only may the audio signal output quality of the multimedia playback device be affected, the speaker inside the multimedia playback device may also be damaged.

SUMMARY

Accordingly, the invention provides an audio signal processing device and an audio signal adjusting method thereof capable of preventing audio signals from distortion and preventing the speaker from being damaged.

An embodiment of the invention provides an audio signal processing device, which includes a gain determining circuit and an audio signal processing circuit. The gain determining circuit receives an analog audio signal. The gain determining circuit determines a gain based on a difference between a predefined threshold and an amplitude of the analog audio signal in response to detecting that a current sampling amplitude of the analog audio signal is greater than the predefined threshold. The audio signal processing circuit is coupled to the gain determining circuit and receives the analog audio signal and the gain. The audio signal processing circuit attenuates the analog audio signal according to the gain to generate an output audio signal.

From another perspective, an embodiment of the invention provides an audio signal adjusting method, which includes steps of: receiving an analog audio signal; determining a gain based on a difference between a predefined threshold and an amplitude of the analog audio signal in response to detecting that a current sampling amplitude of the analog audio signal is greater than the predefined threshold; and attenuating the analog audio signal according to the gain to generate an output audio signal.

Based one the above, in the embodiments of the invention, when the volume is too loud so that the amplitude of the analog audio signal is overly large, the gain determining circuit can instantly and flexibly determine the gain according to the difference between the predefined threshold and the amplitude of the analog audio signal. Accordingly, the audio signal processing circuit can instantly attenuate the analog audio signal according to the adjusted gain, so as to prevent the played sound from the clipping distortion and protect the speaker from being damaged.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
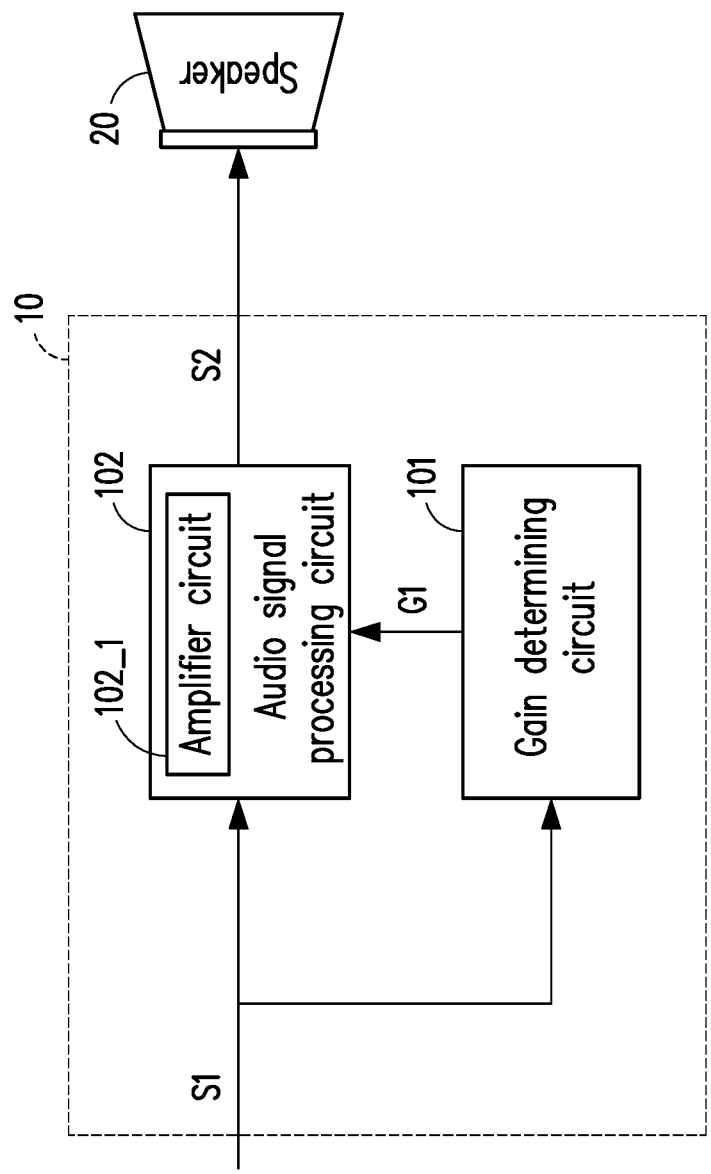
FIG. 1 is a schematic diagram illustrating the audio signal processing device according an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Descriptions of are given with reference to the exemplary embodiments illustrated with accompanied drawings, in which same or similar parts are denoted with same reference numerals. In addition, whenever possible, identical or similar reference numbers stand for identical or similar elements in the figures and the embodiments.

FIG. 1 is a schematic diagram illustrating the audio signal processing device according an embodiment of the invention. With reference to FIG. 1, an audio signal processing device 10 is coupled to a speaker 20, configured to play sound, and applicable to electronic devices such as a smart speaker or a portable music playing device. The audio signal processing device 10 includes a gain determining circuit 101 and an audio signal processing circuit 102. The audio signal processing circuit 102 receives an analog audio signal S1 and a gain G1. The audio signal processing circuit 102 may include an amplifier circuit 102_1, and attenuate the analog audio signal S1 according to the gain G1 determined by the gain determining circuit 101 to thereby generate an output audio signal S2. It should be noted that, when the gain G1 is 1, the analog audio signal S1 will not be attenuated by the audio signal processing circuit 102. When the gain G1 is less than 1, the analog audio signal S1 will be attenuated by the audio signal processing circuit 102. The speaker 20 is configured to generate an audible sound. The audio signal processing circuit 120 is coupled to the speaker 20 and provides the output audio signal S2 for driving the speaker 20.

The gain determining circuit 101 is coupled to audio signal processing circuit 102 and receives the analog audio signal S1. In this embodiment of the invention, the gain determining circuit 101 determines the suitable gain G1 according to the analog audio signal S1. More specifically, the gain determining circuit 101 detects whether an amplitude of the analog audio signal S1 is greater than a predefined threshold. When a current sampling amplitude of the analog audio signal S1 is greater than the predefined threshold, the gain determining circuit 101 starts to determine the gain G1 based on a difference between the predefined threshold and the amplitude (e.g. the current sampling amplitude or the previous sampling amplitude) of the analog audio signal S1, so that the audio signal processing circuit 120 can attenuate the audio signal processing circuit S1 according to the suitable gain G1. The predefined threshold described above may be designed based on actual requirements, and the invention is not limited thereto.

In other words, the gain determining circuit 101 may decrease the gain G1 according to the difference between the predefined threshold and the amplitude of the analog audio signal S1. More specifically, as the amplitude of the analog audio signal S1 changes over time, when detecting that the current sampling amplitude of the analog audio signal S1 is greater than the predefined threshold, the gain G1 will be decreased as the difference between the predefined threshold and the amplitude of the analog audio signal S1 increases. In this way, because the output audio signal S2 for driving the speaker 20 is generated by an attenuation processing based on the gain G1, the clipping distortion can be avoided and the speaker can be prevented from being damaged.

In addition, when the amplitude of the analog audio signal S1 is less than the predefined threshold for more than a predefined time, the gain determining circuit 101 can directly restore the gain G1 to a predefined value or gradually increase the gain G1 back to the predefined value to avoid unnecessary attenuation. Specifically, in the case where the gain G1 is decreased, when the current sampling amplitude of the analog audio signal S1 drops from greater than the predefined threshold to less than the predefined threshold, the gain determining circuit 101 can activate a first counter to start counting. When the first counter counts to a first target value, the gain determining circuit 101 determines to increase the gain.

Details regarding how the gain determining circuit 101 decreases and increases the gain G1 will be described with reference to the following embodiments.

Figure 2:
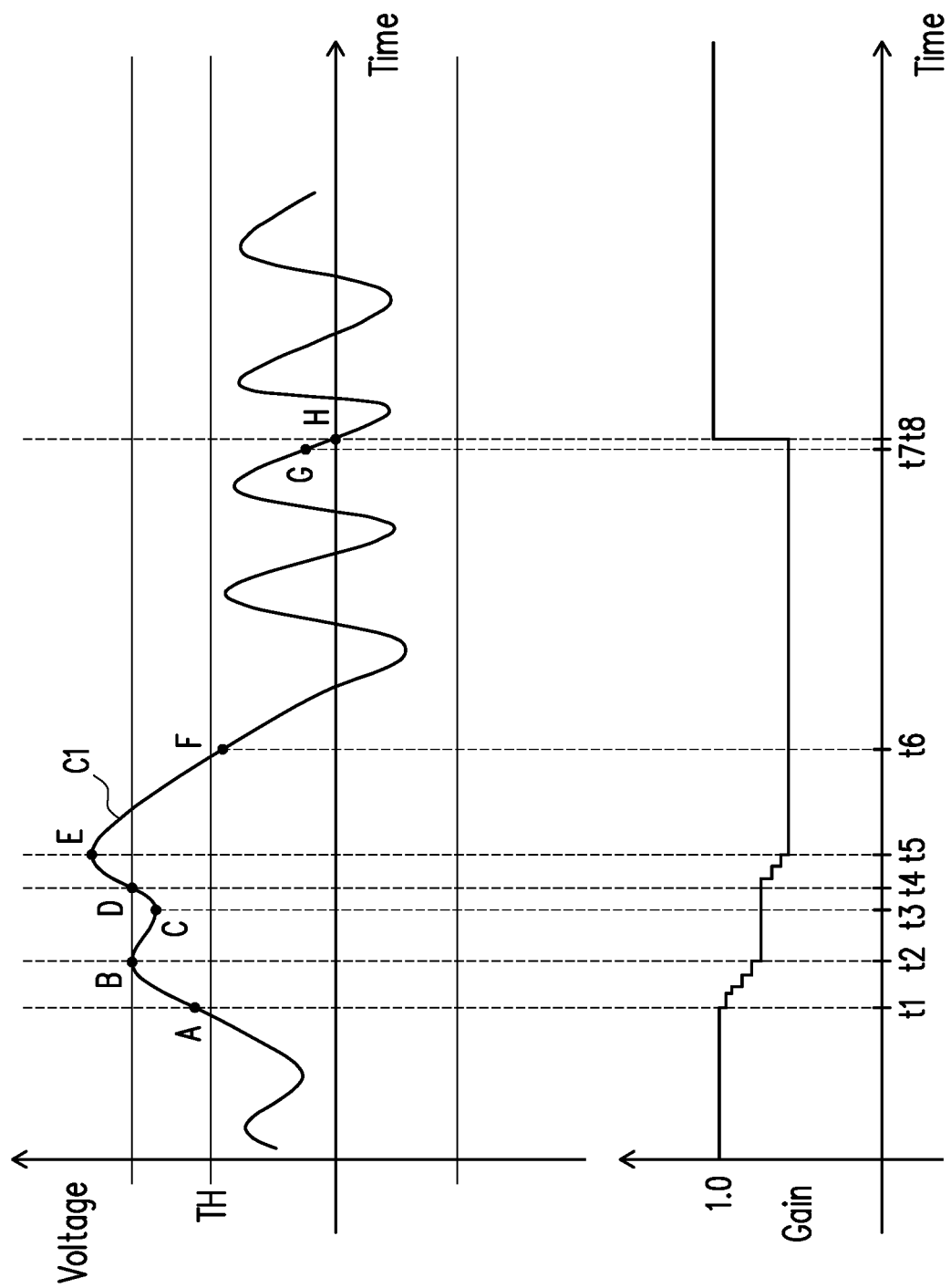
FIG. 2 is a schematic diagram illustrating an example for determining the gain according to an embodiment of the invention.

FIG. 2 is a schematic diagram illustrating an example for determining the gain according to an embodiment of the invention. With reference to FIG. 2, it is assumed that the analog audio signal S1 received by the gain determining circuit 101 is as shown by a curve C1. At time point t1, because the gain determining circuit 101 detects that a current sampling amplitude A is greater than a predefined threshold TH, the gain determining circuit 101 starts to decrease the gain. Between time points t1 and t2, because the difference between the amplitude of the analog audio signal S1 and the predefined threshold TH is also getting larger with the amplitude of the analog audio signal S1 getting larger (rising from the amplitude A to the amplitude B), the gain will be gradually decreased by the gain determining circuit 101 between time points t1 and t2.

In an embodiment, the gain determining circuit 101 can calculate an equation calculated value for decreasing the gain according to an equation (1).

$$Ga=1-(x-TH)*P \qquad \text{the equation (1)}$$

wherein Ga is the equation calculated value, x is the current sampling amplitude of the analog audio signal, TH is the predefined threshold, and P is an adjustment parameter. In the embodiment of FIG. 2, between time points t1 and t2, the gain determining circuit 101 can sequentially obtain multiple gradually increasing current sampling amplitudes (e.g., the current sampling amplitude B can be obtained at time point t2) so the gradually dropped gain may be generated according to the equation (1). However, in another embodiment, the gain determining circuit 101 may also determine the gain by checking a look-up table according to the difference between the amplitude of the analog audio signal S1 and the predefined threshold TH.

It should be noted that, in this embodiment, the gain determining circuit 101 decreases the gain when the current sampling amplitude of the analog audio signal S1 is greater than the predefined threshold and also greater than a maximum amplitude ever appeared. Otherwise, when the current sampling amplitude of the analog audio signal S1 is greater than the predefined threshold but not greater than the maximum amplitude ever appeared, the gain determining circuit 101 will maintain the previously determined gain, that is, not updating the gain determined based on a previous sampling amplitude of the analog audio signal S1. Here, the maximum amplitude ever appeared in the analog audio signal S1 will be recorded and referred to as a maximum recorded value. With FIG. 2 as an example, between time points t1 and t2, because the amplitude of the analog audio signal S1 is getting larger, the maximum recorded value will be constantly updated by the current sampling amplitude current sampled.

In other words, when the current sampling amplitude of the analog audio signal S1 is greater than the predefined threshold TH, the gain determining circuit 101 further determines whether the current sampling amplitude of the analog audio signal S1 is greater than the maximum recorded value. When the current sampling amplitude of the analog audio signal S1 is greater than the maximum recorded value, the gain determining circuit 101 updates the gain according to the difference between the current sampling amplitude and the predefined threshold TH, and uses the current sampling amplitude to update the maximum recorded value. Otherwise, when the current sampling amplitude of the analog audio signal S1 is not greater than the maximum recorded value, the gain determining circuit 101 does not update the gain determined based on the previous sampling amplitude of the analog audio signal S1.

At time point t2, the current sampling amplitude B of the analog audio signal S1 is greater than the predefined threshold TH, and the gain determining circuit 101 determines that the current sampling amplitude B of the analog audio signal S1 is greater than the maximum recorded value recorded at a previous sampling time. Therefore, at time point t2, the gain determining circuit 101 updates the gain according to the difference between the current sampling amplitude B and the predefined threshold TH, and uses the current sampling amplitude B to update the maximum recorded value. In this embodiment, when the current sampling amplitude B of the analog audio signal S1 is greater than the predefined value TH and the maximum recorded value, the gain determining circuit 101 can calculate the equation calculated value for updating the gain based on the current sampling amplitude B and according to the equation (1).

Next, between time points t2 and t3, the amplitude of the analog audio signal S1 is getting smaller (dropping from the amplitude B to the amplitude C). Although the current sampling amplitudes of the analog audio signal S1 between time points t2 and t3 are all greater than the predefined threshold, the current sampling amplitudes of the analog audio signal S1 between time points t2 and t3 are not greater than the maximum recorded value (i.e., the previous sampling amplitude B corresponding to time point t2). Therefore, the gain determining circuit 101 does not update the gain determined based on the previous sampling amplitude B of the analog audio signal S1. Between time points t3 and t4, the amplitude of the analog audio signal S1 is getting larger (rising from the amplitude C to the amplitude D). Although the current sampling amplitudes of the analog audio signal S1 between time points t3 and t4 are all greater than the predefined threshold, the current sampling amplitudes of the analog audio signal S1 between time points t3 and t4 are not greater than the maximum recorded value (i.e., the previous sampling amplitude B corresponding to time point t2). Therefore, the gain determining circuit 101 does not update the gain determined based on the previous sampling amplitude B of the analog audio signal S1.

Then, between time points t4 and t5, the amplitude of the analog audio signal S1 is getting larger (rising from the amplitude D to the amplitude E). Accordingly, the operation of the gain determining circuit 101 between time points t4 and t5 is similar to the operation between time points t1 and t2, that is, constantly decreasing the gain and constantly updating the maximum recorded value. Between time points t5 and t6, the amplitude of the analog audio signal S1 is getting smaller (dropping from the amplitude E to the amplitude F). Accordingly, the operation of the gain determining circuit 101 between time points t5 and t6 is similar to the operation between time points t2 and t4, that is, maintaining the gain determined based on the previous sampling amplitude E of the analog audio signal S1 without updating the maximum recorded value.

At time point t6, the gain determining circuit 101 determines that the current sampling amplitude of the analog audio signal S1 drops from greater than the predefined threshold TH to less than the predefined threshold TH. When the current sampling amplitude of the analog audio signal S1 drops from greater than the predefined threshold TH to less than the predefined threshold TH, the gain determining circuit 101 activates the first counter to start counting. Between time points t6 and t7, since the amplitude of the analog audio signal S1 does not appear to be greater than the predefined threshold TH, the first counter continues to count. At time point t7, the first counter counts to the first target value. When the first counter counts to the first target value, the gain determining circuit 101 determines to increase the gain. The first target value described above may be designed based on actual requirements. In other words, when the amplitude of the analog audio signal S1 is continuously less than the predefined threshold TH for more than the predefined time, the gain determining circuit 101 determines to increase the decreased gain. It should be noted that, while the first counter is counting, in response to the current sampling amplitude of the analog audio signal S1 being greater than the predefined threshold TH, the gain determining circuit 101 resets the first counter to zero to avoid adjusting the gain too frequently.

In the embodiment of FIG. 2, after the first counter counts to the first target value, at time point t8, the gain determining circuit 101 restores the gain to the predefined value when the gain determining circuit 101 detects that the current sampling amplitude H of the analog audio signal S1 crosses a zero point (e.g. 0 volt). Although FIG. 2 illustrates that the gain determining circuit 101 restores the gain to 1, the invention is not limited thereto. This predefined value may be designed based on actual requirements. In other words, the gain determining circuit 101 may include a zero-crossing detector to detect whether the current sampling amplitude H of the analog audio signal S1 crosses the zero point.

Figure 3:
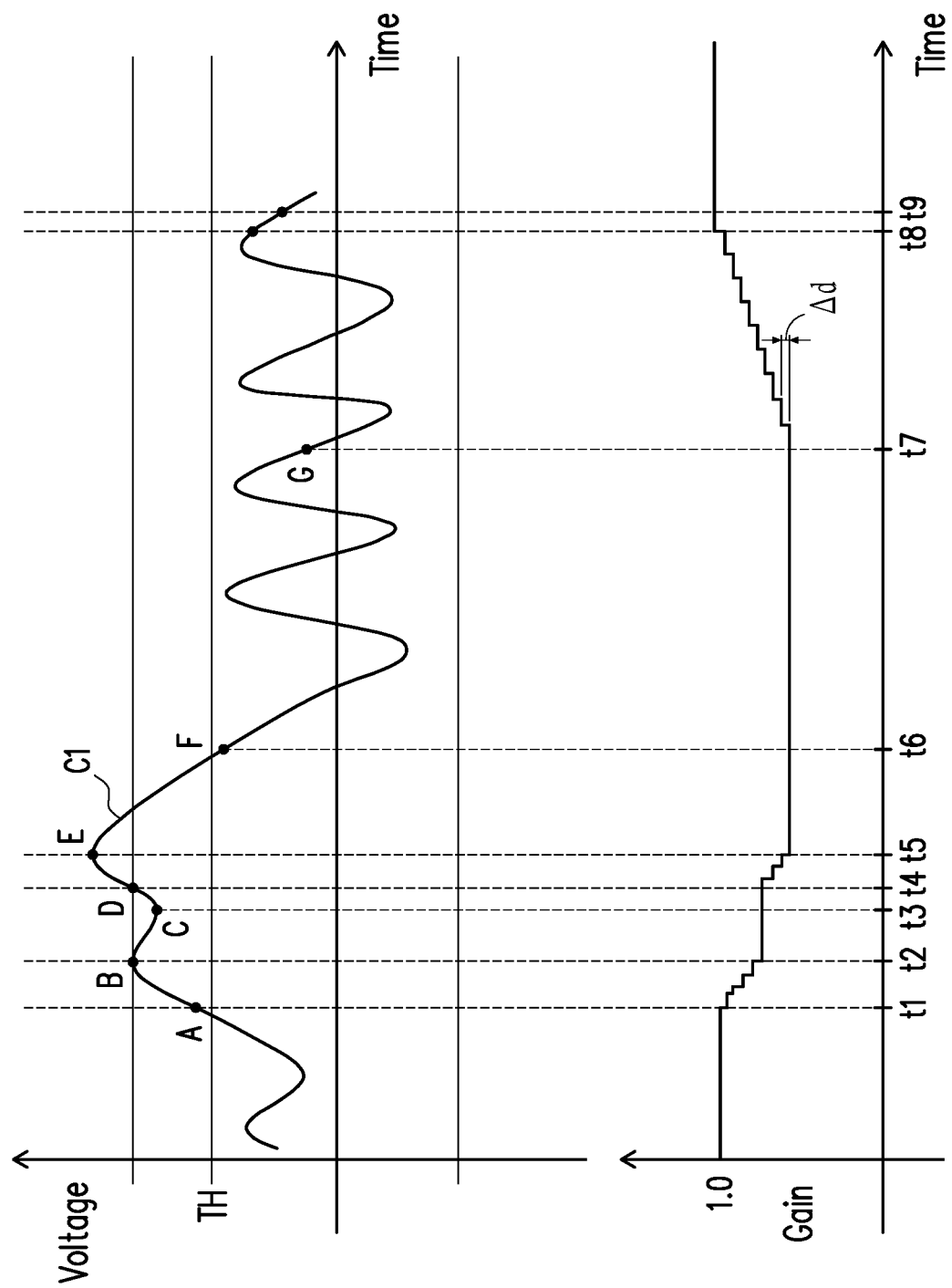
FIG. 3 is a schematic diagram illustrating an example for determining the gain according to an embodiment of the invention.

FIG. 3 is a schematic diagram illustrating an example for determining the gain according to an embodiment of the invention. With reference to FIG. 3, operations between time points t1 and t7 in FIG. 3 are similar to the operations between time points t1 and t7 in FIG. 2, which are repeated hereinafter. The difference between embodiment of FIG. 3 and the embodiment of FIG. 2 is the method for increasing the gain after the first counter counts to the first target value. In the embodiment of FIG. 3, at time point t7, after the first counter counts to the first target value, the gain determining circuit 101 activates a second counter to start counting. In response to that the second counter counts to a second target value, the gain determining circuit 101 adds a predefined interval Δd to the current gain. The predefined interval Δd described above may be designed based on actual requirements. Between time points t7 and t8, when the second counter counts to the second target value, the gain determining circuit 101 progressively increases the gain by the predefined interval Δd until the gain is restored to the predefined value. At time point t9, since the gain restored to the predefined value, the gain determining circuit 101 no longer needs to progressively increase the gain by the predefined interval Δd. Although FIG. 3 illustrates that the gain determining circuit 101 restores the gain to 1, the invention is not limited thereto. Compared with FIG. 2 in which the gain is directly restored to the predefined value, the gain is increased back to the predefined value in a progressive manner in the embodiment of FIG. 3, so as to prevent the user from noticing unusual ups and downs of an output volume due to a sharp increase in the gain.

In the embodiment of FIG. 3, while the gain determining circuit 101 is progressively increasing the gain repeatedly by the predefined interval Δd, since the amplitude of the analog audio signal S1 does not exceed the predefined threshold, the gain determining circuit 101 continues to progressively increase the gain repeatedly by the predefined interval Δd. However, in an embodiment, while the gain determining circuit 101 is progressively increasing the gain repeatedly by the predefined interval, when the current sampling amplitude of the analog audio signal S1 is greater than the predefined threshold, the gain determining circuit 101 will execute a corresponding operation according to a comparison result of the current gain and the equation calculated value. Details regarding the above are provided with reference to the following embodiments.

Figure 4:
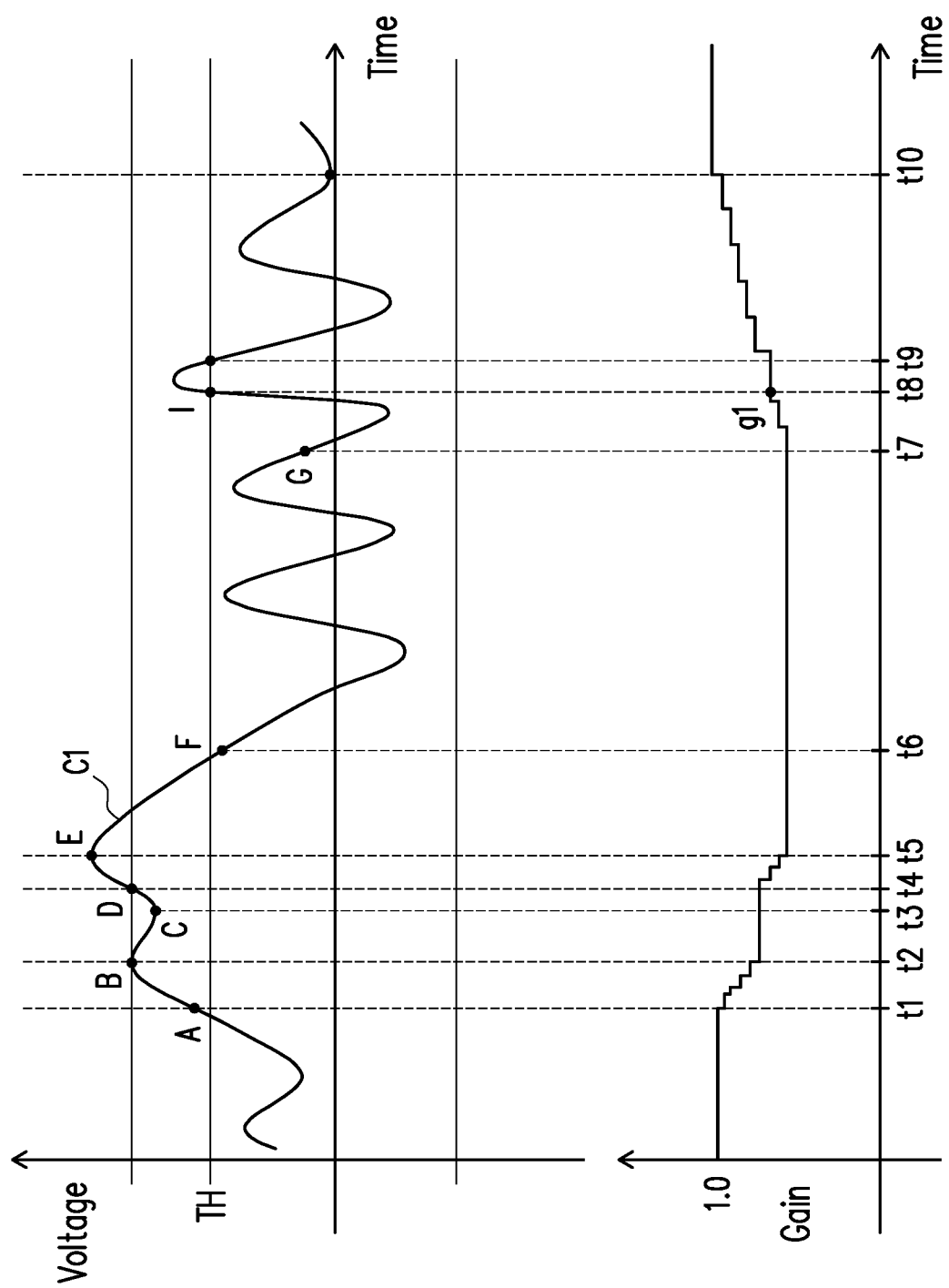
FIG. 4 is a schematic diagram illustrating an example for determining the gain according to an embodiment of the invention.

FIG. 4 is a schematic diagram illustrating an example for determining the gain according to an embodiment of the invention. Operations between time points t1 and t7 in FIG. 4 are similar to the operations between time points t1 and t7 in FIG. 3, which are repeated hereinafter. The embodiment of FIG. 4 differs from the embodiment of FIG. 3 in that, the analog audio signal S1 appears to be greater than predefined threshold TH while the gain is being progressively increased according to the predefined interval Δd. With reference to FIG. 4, while the gain determining circuit 101 is progressively increasing the gain repeatedly by the predefined interval Δd, at time point t8, the gain determining circuit 101 detects that the current sampling amplitude I of the analog audio signal S1 is greater than the predefined threshold TH. In response to detecting that the current sampling amplitude I of the analog audio signal S1 is greater than the predefined threshold TH, the gain determining circuit 101 determines whether the current gain g1 is greater than the equation calculated value (such equation calculated value is obtained through calculation with the current sampling amplitude substituted in the equation (1)). In the example of FIG. 4, the current gain g1 is less than the equation calculated value. Therefore, at time point t8, when the current gain g1 is less than the equation calculated value, the gain determining circuit 101 does not update the gain and resets the second counter to zero to extend the time required for the gain to be restored to the predefined value. That is to say, between time points t8 and t9, since the gain determining circuit 101 determines that the current gains are all greater than the equation calculated value, the gain determining circuit 101 repeatedly resets the second counter to zero so that the gain does not change between time points t8 and t9. Next, between time points t9 and t10, because the current sampling amplitudes of the analog audio signal S1 are all less than the predefined threshold, the gain determining circuit 101 continues to progressively increase the gain repeatedly by the predefined interval until the gain is equal to the predefined value.

Further, it should be noted that, compared with the example in which the gains between time points t8 and t9 shown in FIG. 4 are all greater than the equation calculated value, when the current sampling amplitude of the analog audio signal S1 is greater than the predefined threshold and the current gain is greater than the equation calculated value, the gain determining circuit 101 uses the equation calculated value to update the gain so that the gain is dropped.

Figure 5A:
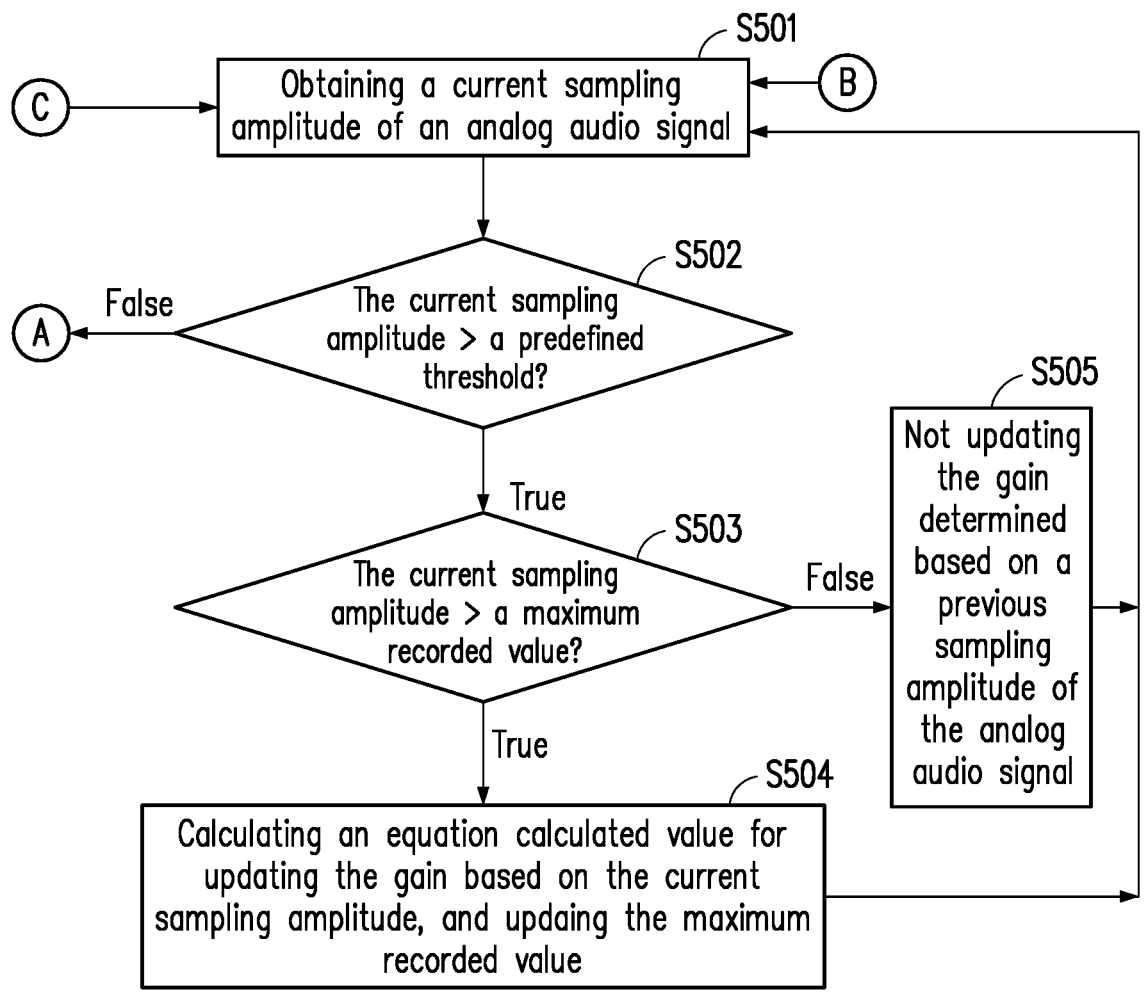
FIG. 5A and FIG. 5B are flowcharts illustrating the audio signal adjusting method according to an embodiment of the invention.
Figure 5B:
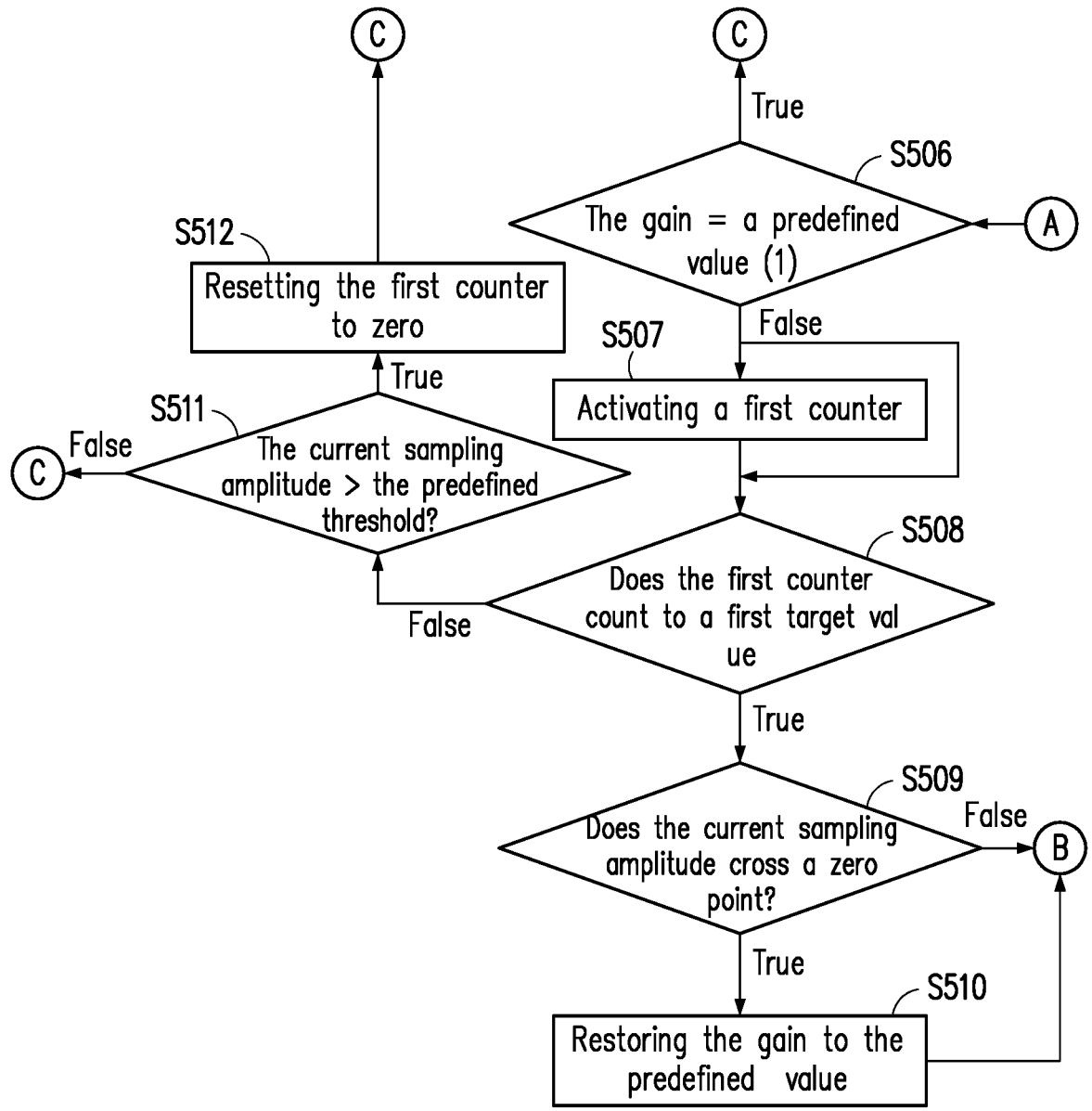

FIG. 5A and FIG. 5B are flowcharts illustrating the audio signal adjusting method according to an embodiment of the invention. Enough teaching, suggestion, and implementation illustration related to implementation details and related device features of the audio signal adjusting method of the present embodiment can be obtained form the descriptions in each embodiment of FIG. 1 to FIG. 4 above, which are not repeated hereinafter.

In step S501, a current sampling amplitude of an analog audio signal is obtained. In step S502, whether the current sampling amplitude is greater than a predefined threshold is determined. If the current sampling amplitude is greater than the predefined threshold (the result of the determination in step S502 is True), in step S503, whether the current sampling amplitude is greater than a maximum recorded value is determined. If the current sampling amplitude of the analog audio signal is greater than the maximum recorded value (the result of the determination in step S503 is True), in step S504, an equation calculated value for updating the gain is calculated based on the current sampling amplitude, and the maximum recorded value is updated. If the current sampling amplitude of the analog audio signal is not greater than the maximum recorded value (the result of the determination in step S503 is False), in step S505, the gain determined based on a previous sampling amplitude of the analog audio signal is not updated.

On the other hand, if the current sampling amplitude is not greater than the predefined threshold (the result of the determination in step S502 is False), in step S506, whether the gain is equal to a predefined value is determined. If the gain is not equal to the predefined value, it means that gain is still being decreased. Here, when the gain is not equal to the predefined value and a first counter is not yet activated, in step S507, the first counter is activated. When the gain is not equal to the predefined value but the first counter is activated, the method proceeds to step S508. In step S508, whether the first counter counts to a first target value is determined, so as to determine whether to increase the gain or not. If the first counter counts to the first target value (the result of the determination in step S508 is True), in step S509, whether the current sampling amplitude of the analog audio signal crosses a zero point is determined. If the current sampling amplitude of the analog audio signal crosses the zero point (the result of the determination in step S509 is True), in step S510, the gain is restored to the predefined value. If the first counter does not count to the first target value (the result of the determination in step S508 is False), in step S511, whether the current sampling amplitude is greater than the predefined threshold is determined. If the current sampling amplitude is greater than the predefined threshold (the result of the determination in step S511 is True), in step S512, the first counter is reset to zero.

Figure 6A:
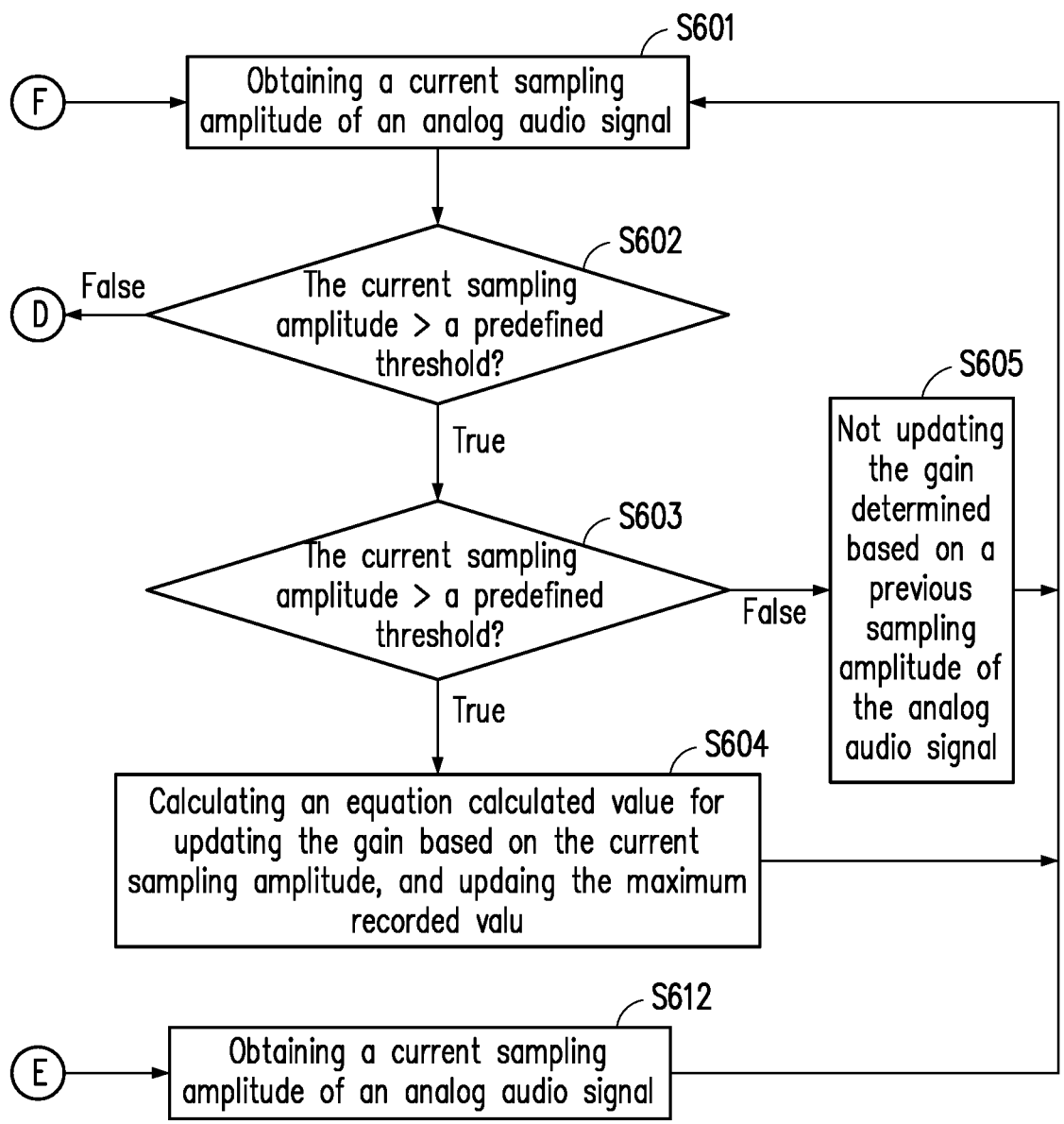
FIG. 6A and FIG. 6B are flowcharts illustrating the audio signal adjusting method according to an embodiment of the invention.
Figure 6B:
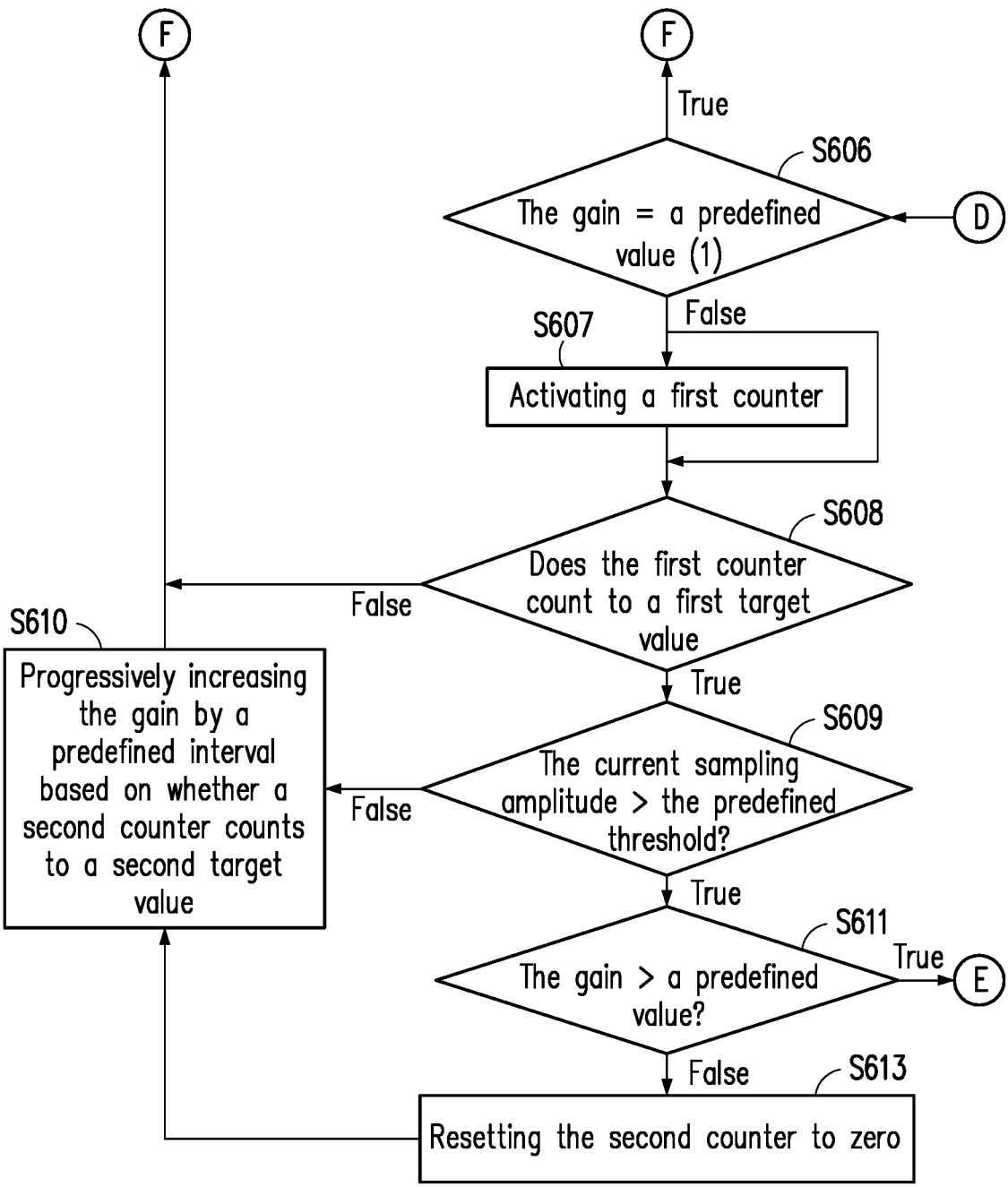

FIG. 6A and FIG. 6B are flowcharts illustrating the audio signal adjusting method according to an embodiment of the invention. Enough teaching, suggestion, and implementation illustration related to implementation details and related device features of the audio signal adjusting method of the present embodiment can be obtained form the descriptions in each embodiment of FIG. 1 to FIG. 4 above, which are not repeated hereinafter.

In step S601, a current sampling amplitude of an analog audio signal is obtained. In step S602, whether the current sampling amplitude is greater than a predefined threshold is determined. If the current sampling amplitude is greater than the predefined threshold (the result of the determination in step S602 is True), in step S603, whether the current sampling amplitude is greater than a maximum recorded value is determined. If the current sampling amplitude of the analog audio signal is greater than the maximum recorded value (the result of the determination in step S603 is True), in step S604, an equation calculated value for updating the gain is calculated based on the current sampling amplitude, and the maximum recorded value is updated. If the current sampling amplitude of the analog audio signal is not greater than the maximum recorded value (the result of the determination in step S603 is False), in step S605, the gain determined based on a previous sampling amplitude of the analog audio signal is not updated.

On the other hand, if the current sampling amplitude is not greater than the predefined threshold (the result of the determination in step S602 is False), in step S606, whether the gain is equal to a predefined value is determined. If the gain is not equal to the predefined value, it means that gain is still being decreased. Here, when the gain is not equal to the predefined value and a first counter is not activated, in step S607, the first counter is activated. When the gain is not equal to the predefined value but the first counter is activated, the method proceeds to step S608. In step S608, whether the first counter counts to a first target value is determined, so as to determine whether to increase the gain or not.

If the first counter counts to the first target value (the result of the determination in step S608 is True), in the embodiment of FIG. 6A and FIG. 6B, the gain will be progressively increased by the predefined interval or the gain will be updated by using the equation calculated value. More specifically, in step S609, whether the current sampling amplitude is greater than a predefined threshold is determined. If the current sampling amplitude is not greater than the predefined threshold (the result of the determination in step S609 is False), in step S610, the gain is progressively increased by the predefined interval based on whether a second counter counts to a second target value. If the current sampling amplitude is greater than the predefined threshold (the result of the determination in step S609 is True), in step S611, whether the gain is greater than an equation calculated value is determined. If the gain is greater than the equation calculated value (the result of the determination in step S611 is True), in step S612, the gain is updated by the equation calculated value. If the gain is greater than the equation calculated value (the result of the determination in step S611 is False), in step S613, the second counter is reset to zero so that the second counter is reset to zero to suspend progressively increasing the gain by the predefined interval.

In summary, in the embodiments of the invention, when detecting that the amplitude of the analog audio signal is greater than the predefined threshold, the gain may be instantly decreased so the analog audio signal may be attenuated properly. As a result, the excessive amplitude of the analog audio signal for driving the speaker can be avoided at a relatively fast response speed, thereby avoiding the output audio signal from distortion and improving the audio signal output quality. In addition, the speaker may also be prevented from being damaged by the analog audio signal whose amplitude is overly large.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An audio signal processing device, comprising:
a gain determining circuit, receiving an analog audio signal, and determining a gain based on a difference between a predefined threshold and an amplitude of the analog audio signal in response to detecting that a current sampling amplitude of the analog audio signal is greater than the predefined threshold; and
an audio signal processing circuit, coupled to the gain determining circuit, receiving the analog audio signal and the gain, and attenuating the analog audio signal according to the gain to generate an output audio signal,
wherein the gain determining circuit determines whether the current sampling amplitude of the analog audio signal is greater than a maximum recorded value when the current sampling amplitude of the analog audio signal is greater than the predefined threshold; and
when the current sampling amplitude of the analog audio signal is greater than the maximum recorded value, the gain determining circuit updates the gain according to a difference between the current sampling amplitude and the predefined threshold and uses the current sampling amplitude to update the maximum recorded value.

2. The audio signal processing device according to claim 1, wherein the gain determining circuit does not update the gain determined based on a previous sampling amplitude of the analog audio signal when the current sampling amplitude of the analog audio signal is not greater than the maximum recorded value.

3. The audio signal processing device according to claim 1, wherein the gain determining circuit calculates an equation calculated value for updating the gain based on the current sampling amplitude when the current sampling amplitude of the analog audio signal is greater than the predefined threshold and the maximum recorded value, wherein an equation for calculating the equation calculated value is expressed as:

$$Ga=1-(x-TH)*P$$

wherein Ga is the equation calculated value, x is the current sampling amplitude of the analog audio signal, TH is the predefined threshold, and P is an adjustment parameter.

4. The audio signal processing device according to claim 1, wherein the gain determining circuit activates a first counter to start counting when the current sampling amplitude of the analog audio signal drops from greater than the predefined threshold to less than the predefined threshold; and
the gain determining circuit determines to increase the gain when the first counter counts to a first target value.

5. The audio signal processing device according to claim 4, wherein after the first counter counts to the first target value, the gain determining circuit restores the gain to a predefined value when the gain determining circuit detects that the current sampling amplitude of the analog audio signal crosses a zero point.

6. The audio signal processing device according to claim 5, wherein while the first counter is counting, the gain determining circuit resets the first counter to zero in response to detecting that the current sampling amplitude of the analog audio signal is greater than the predefined threshold.

7. The audio signal processing device according to claim 4, wherein after the first counter counts to the first target value, the gain determining circuit activates a second counter to start counting; and
the gain determining circuit progressively increases the gain by a predefined interval until the gain is restored to a predefined value when the second counter counts to a second target value.

8. The audio signal processing device according to claim 7, wherein while the gain determining circuit is progressively increasing the gain repeatedly by the predefined interval, the gain determining circuit determines whether the gain is greater than an equation calculated value in response to detecting that the current sampling amplitude of the analog audio signal is greater than the predefined threshold, wherein an equation for calculating the equation calculated value is expressed as:

$$Ga=1-(x-TH)*P$$

wherein Ga is the equation calculated value, x is the current sampling amplitude of the analog audio signal, TH is the predefined threshold, and P is an adjustment parameter;
the gain determining circuit uses the equation calculated value to update the gain when the gain is greater than the equation calculated value; and
the gain determining circuit does not update the gain and resets the second counter to zero when the gain is less than the equation calculated value.

9. An audio signal adjusting method, comprising:
receiving an analog audio signal;
determining a gain based on a difference between a predefined threshold and an amplitude of the analog audio signal in response to detecting that a current sampling amplitude of the analog audio signal is greater than the predefined threshold; and attenuating the analog audio signal according to the gain to generate an output audio signal, wherein the step of determining the gain based on the difference between the predefined threshold and the amplitude of the analog audio signal in response to detecting that the current sampling amplitude of the analog audio signal is greater than the predefined threshold comprises:

determining whether the current sampling amplitude of the analog audio signal is greater than a maximum recorded value when the current sampling amplitude of the analog audio signal is greater than the predefined threshold; and when the current sampling amplitude of the analog audio signal is greater than the maximum recorded value, updating the gain according to a difference between the current sampling amplitude and the predefined threshold and using the current sampling amplitude to update the maximum recorded value.

10. The audio signal adjusting method according to claim 9, wherein the step of determining the gain based on the difference between the predefined threshold and the amplitude of the analog audio signal in response to detecting that the current sampling amplitude of the analog audio signal is greater than the predefined threshold further comprises:

not updating the gain determined based on a previous sampling amplitude of the analog audio signal when the current sampling amplitude of the analog audio signal is not greater than the maximum recorded value.

11. The audio signal adjusting method according to claim 9, wherein the step of updating the gain according to the difference between the current sampling amplitude and the predefined threshold when the current sampling amplitude of the analog audio signal is greater than the maximum recorded value comprises:

calculating an equation calculated value for updating the gain based on the current sampling amplitude, wherein an equation for calculating the equation calculated value is expressed as:

$$Ga=1-(x-TH)*P$$

wherein Ga is the equation calculated value, x is the current sampling amplitude of the analog audio signal, TH is the predefined threshold, and P is an adjustment parameter.

12. The audio signal adjusting method according to claim 9, further comprising:

activating a first counter to start counting when the current sampling amplitude of the analog audio signal drops from greater than the predefined threshold to less than the predefined threshold; and determining to increase the gain when the first counter counts to a first target value.

13. The audio signal adjusting method according to claim 12, wherein the step of determining to increase the gain when the first counter counts to the first target value comprises:

after the first counter counts to the first target value, restoring the gain to a predefined value when detecting that the current sampling amplitude of the analog audio signal crosses a zero point.

14. The audio signal adjusting method according to claim 13, further comprising:

while the first counter is counting, resetting the first counter to zero in response to detecting that the current sampling amplitude of the analog audio signal is greater than the predefined threshold.

15. The audio signal adjusting method according to claim 12, wherein the step of determining to increase the gain when the first counter counts to the first target value comprises:

after the first counter counts to the first target value, activating a second counter to start counting; and progressively increasing the gain by a predefined interval when the second counter counts to a second target value.

16. The audio signal adjusting method according to claim 15, further comprising:

while progressively increasing the gain repeatedly by the predefined interval, determining whether the gain is greater than an equation calculated value in response to detecting that the current sampling amplitude of the analog audio signal is greater than the predefined threshold, wherein an equation for calculating the equation calculated value is expressed as:

$$Ga=1-(x-TH)*P$$

wherein Ga is the equation calculated value, x is the current sampling amplitude of the analog audio signal, TH is the predefined threshold, and P is an adjustment parameter;

using an equation calculated value to update the gain when the gain is greater than the equation calculated value; and not updating the gain and resetting the second counter to zero when the gain is less than the equation calculated value.

* * * * *